(12) United States Patent
Kim

(10) Patent No.: US 6,326,312 B1
(45) Date of Patent: Dec. 4, 2001

(54) CONTACT HOLE OF SEMICONDUCTOR AND ITS FORMING METHOD

(75) Inventor: Dong Seok Kim, Seoul (KR)

(73) Assignee: LG Semicon Co., Ltd., Chungcheongbuk-Do (KR)

(*) Notice: Subject to any disclaimer, the term of this patent is extended or adjusted under 35 U.S.C. 154(b) by 0 days.

(21) Appl. No.: 09/204,542

(22) Filed: Dec. 3, 1998

(30) Foreign Application Priority Data

Dec. 30, 1997 (KR) .................................................. 97-79129

(51) Int. Cl.[7] .................................................. H01L 21/311
(52) U.S. Cl. .......................... 438/696; 438/640; 438/725
(58) Field of Search .................................. 438/696, 638, 438/639, 640, 725, 700, 701

(56) References Cited

U.S. PATENT DOCUMENTS

| | | | |
|---|---|---|---|
| 5,338,399 | * | 8/1994 | Yanagida . |
| 5,378,654 | | 1/1995 | Hsue .................................... 437/195 |
| 5,550,071 | | 8/1996 | Ryou ...................................... 437/41 |
| 5,562,801 | * | 10/1996 | Nulty . |
| 5,783,496 | * | 7/1998 | Flanner et al. ........................ 438/743 |
| 6,028,001 | * | 2/2000 | Shin ..................................... 438/640 |
| 6,037,261 | * | 3/2000 | Jost et al. .............................. 438/696 |
| 6,191,042 | * | 2/2001 | Tsai et al. . |

OTHER PUBLICATIONS

S. Wolf, et al. "Silicon Processing for the VLSI Era, vol. 1"Lattice Press, pp. 540–541. 1986.*

* cited by examiner

*Primary Examiner*—Caridad Everhart
(74) *Attorney, Agent, or Firm*—Morgan, Lewis & Bockius LLP

(57) ABSTRACT

Provided with a contact hole of a semiconductor device and its forming method which is adapted to form double slopes in the insulating layer, with the contact hole including an insulating layer formed on a semiconductor substrate, and a contact hole having double slopes, exposing a defined region of the semiconductor substrate.

11 Claims, 7 Drawing Sheets

FIG.5

| reaction gas<br>determination factor | CHF₃ | C₂HF₅ | C₄F₈ |
|---|---|---|---|
| contact hole is large | maintained | maintained | increased |
| contact hole is deep | maintained | maintained | decreased |
| contact surface area is large | decreased | maintained | decreased |
| insulating layer is hard | maintained | decreased | decreased |

CONTACT HOLE OF SEMICONDUCTOR AND ITS FORMING METHOD

BACKGROUND OF THE INVENTION

1. Field of the Invention

The present invention relates to a process for fabricating a semiconductor device and, more particularly, to a contact hole of a semiconductor device and its forming method constituted by selectively etching an insulating layer to provide the contact hole with double slopes.

2. Discussion of Related Art

As a rule, a process of forming the metal line in a device such as DRAM is constituted by providing a cap structure of the metal line (conductive layer/nitride layer) and forming a sidewall by way of deposition/etching step of the nitride layer, with the cap structure and the sidewall being used as an etching-resistant layer in forming a contact hole, which process is termed SAC (Self Aligned Contact).

A conventional method of forming a contact hole of a semiconductor device will be described below in connection with the attached drawings.

FIGS. 1a–1f are cross-sectional views illustrating the formation of a contact hole making use of the SAC according to prior art.

As shown in FIG. 1a, a conductive layer 12 for forming a lower line is first formed on a semiconductor substrate 11, followed by forming a first nitride layer 13 on the conductive layer 12.

Next, a photo resist overlies the first nitride layer 13 and undergoes exposure and development, patterned into a first mask pattern 14.

As shown in FIG. 1b, using the first mask pattern 14 as a mask, the first nitride layer 13 and the conductive layer 12 are selectively etched to form a first nitride layer pattern 13a and a lower line 12a.

As shown in FIG. 1c, following removal of the first mask pattern 14, a second nitride layer 15 is formed on the whole surface of the semiconductor substrate 11 including the first nitride pattern 13a and the lower line 12a.

As shown in FIG. 1d, the second nitride layer 15 is etched back, forming a second nitride layer sidewall 15a on both sides of the first nitride layer pattern 13a and the lower line 12a.

As shown in FIG. 1e, a planarizing insulating layer 16 is formed by the SOG (Spin On Glass) on the whole surface of the semiconductor substrate 11 including the lower line 12a encompassed with cap layers such as the second nitride sidewall 15a and the first nitride layer pattern 13a.

A photo resist overlies the planarizing insulating layer 16, followed by exposure and development, forming a second mask pattern 17.

A contact hole 18 is then formed by conducting the SAC, making use of the second mask pattern 17 as a mask, as illustrated in FIG. 1.

Such as in the prior art above described, the process of forming a contact hole by the SAC of a semiconductor device uses a nitride layer as an etching-resistant layer on the surface of and on the lateral sides of the lower line 12a.

In order to have a high etching selective ratio, it is preferable to thicken the nitride layer which is used as a cap layer for preventing short-circuits between the lines.

Though not shown in the figures, the subsequent process is constituted by providing a conductive plug inside the contact hole and forming the upper line which is electrically connected to the lower line via the conductive plug.

However, such a conventional process of forming a contact hole of a semiconductor device involves some problems as follows:

First, an increase in the thickness of the nitride layer used as a cap layer for encompassing the conductive material increases the period of time for the process, and the increased thickness of the nitride layer at the edge of the metal line in the SAC process limits the reduction of the design rules.

Secondly, the cap layer is needed to encompass the conductive material, resulting in an increase in the time and costs required for the entire process.

SUMMARY OF THE INVENTION

Accordingly, the present invention is directed to a contact hole of a semiconductor device and its forming method that substantially obviates one or more of the problems due to limitations and disadvantages of the related art.

An object of the present invention is to provide a contact hole of a semiconductor device and its forming method which is adapted to reduce the time and costs for the entire process with a consequence of higher reliability of the device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a contact hole of a semiconductor device includes: an insulating layer formed on a semiconductor substrate; and a contact hole having double slopes, exposing a defined region of the semiconductor substrate.

Further, a method of forming the contact hole of a semiconductor device includes the steps of: forming a conductive layer on a semiconductor substrate, and subsequently a first mask pattern on the conductive layer; selectively eliminating the conductive layer making use of the first mask pattern as a mask, forming a lower line; removing the first mask pattern, and forming an insulating layer on the whole surface of the semiconductor substrate including the lower line; forming a second mask pattern on the insulating layer; etching the insulating layer to a specified depth making use of the second mask pattern as a mask, accumulating a polymer layer on the lateral sides of and on the lower part of the etched insulating layer, thereby forming the upper part of the contact hole having a first slope; and forming the lower part of the contact hole having a second slope, making use of the polymer layer and the second mask pattern as a mask, thereby exposing a defined portion of the surface on the semiconductor substrate.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIG. 5 is a diagram illustrating the factors that determine the ratio of reaction gases in forming the contact hole having double slopes according to the present invention.

DETAILED DESCRIPTION OF PREFERRED EMBODIMENT

Reference will now be made in detail to the preferred embodiments of the present invention, examples of which are illustrated in the accompanying drawings.

Below is a detailed description of a contact hole in a semiconductor device and its formation according to the present invention with reference to the figures.

Figure 1A:
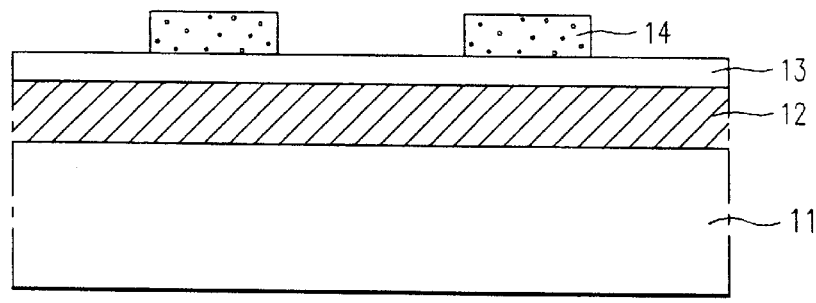
FIGS. 1a–1f are cross-sectional views illustrating the process for forming a contact hole making use of an SAC according to prior art.
Figure 1B:
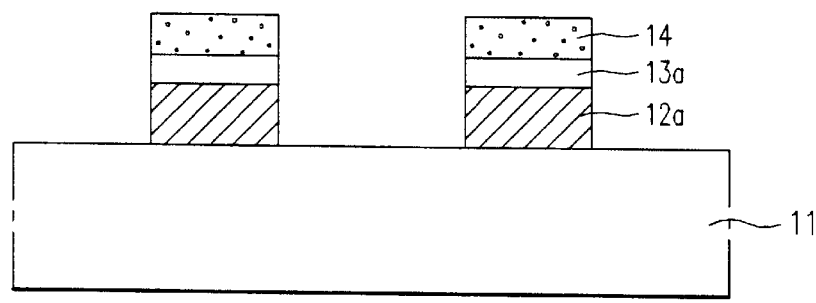
Figure 1C:
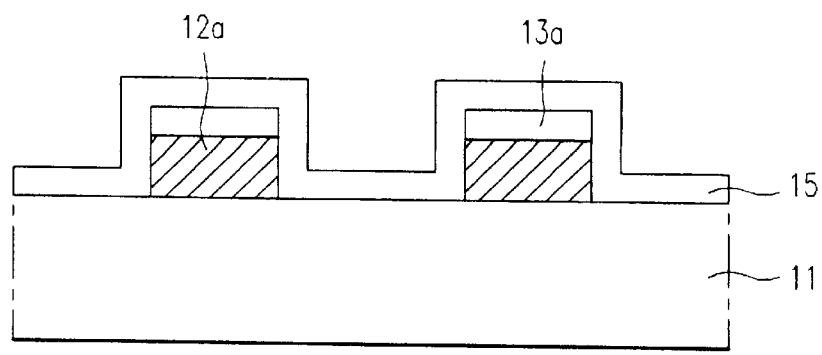
Figure 1D:
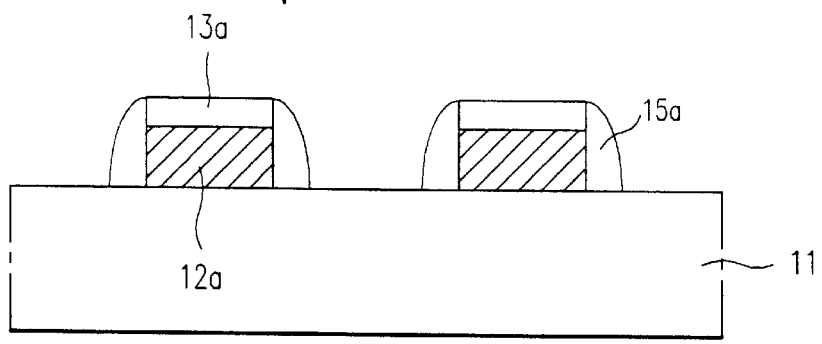
Figure 1E:
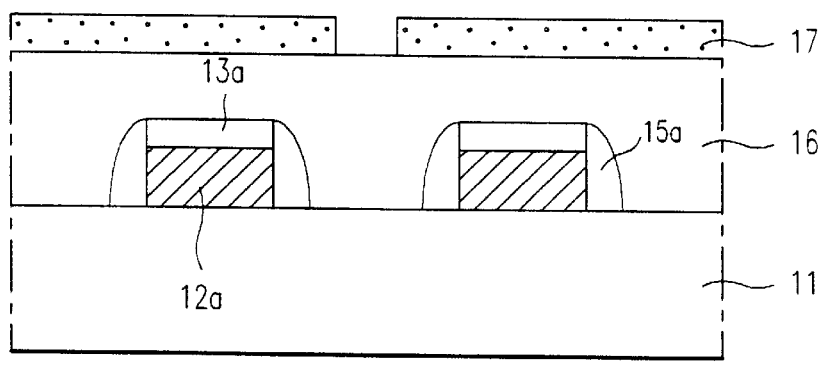
Figure 1F:
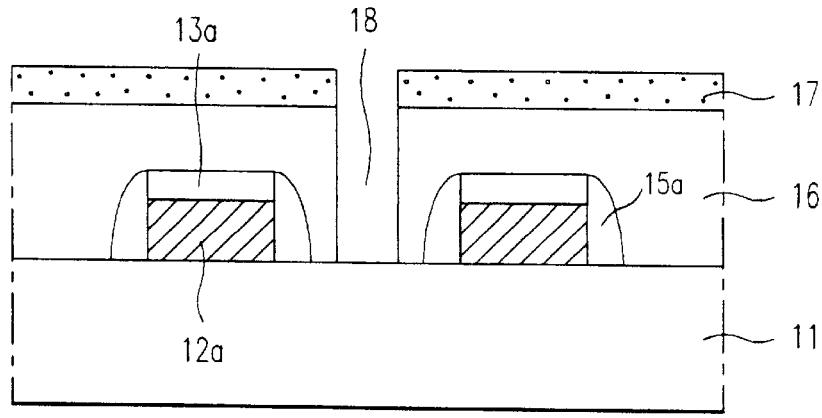
Figure 2:
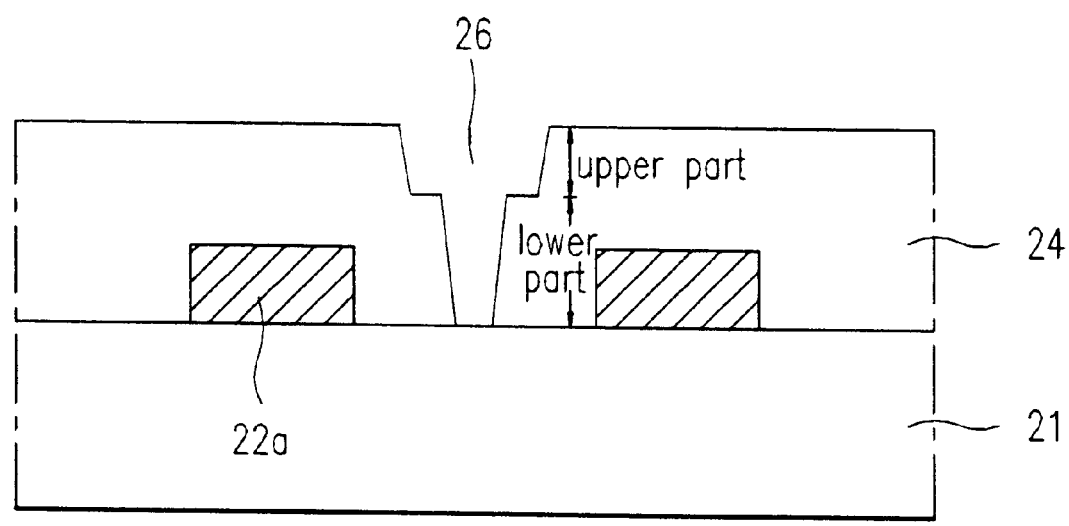
FIG. 2 is a cross-sectional view illustrating a contact hole of a semiconductor device according to the present invention.

FIG. 2 is a cross-sectional view illustrating such a contact hole of the present invention.

The semiconductor device, as shown in FIG. 2, is composed of a lower line 22a formed at defined intervals on a semiconductor substrate 21, a planarizing insulating layer 24 overlying the whole surface of the semiconductor device 21 including the lower line 22a, and a contact hole 26 having top and lower parts, wherein the upper part has a first slope greater than a second slope of the lower part so as to expose a defined part of the surface on the semiconductor substrate 21.

As regards the contact hole 26, the first slope is in the range of 83–88° with the second slope of the lower part being 73–83°, which is preferably 60–70% of the first slope in width.

On the other hand, the upper part is a position where the second slope starts from the planarizing insulating layer 24 while the lower part ranges from the position to the surface of the semiconductor substrate 21.

FIGS. 3a–3d are cross-sectional views illustrating the process for forming the contact hole of a semiconductor device as described above, and FIG. 4 is a detailed cross-sectional view to show the process of forming a contact hole having double slopes according to the present invention.

Figure 3A:
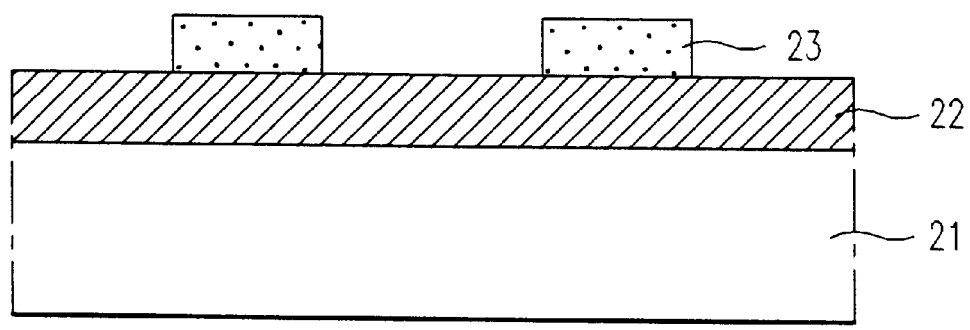
FIGS. 3a–3d are cross-sectional views illustrating the process for forming the contact hole of a semiconductor device according to the present invention.

As shown in FIG. 3a, a conductive layer 22 for forming a lower line is first formed on a semiconductor substrate 21, followed by forming a photo resist overlying the conductive layer 22, with the photo resist being subject to exposure and development to be patterned into a first mask pattern 23.

Figure 3B:
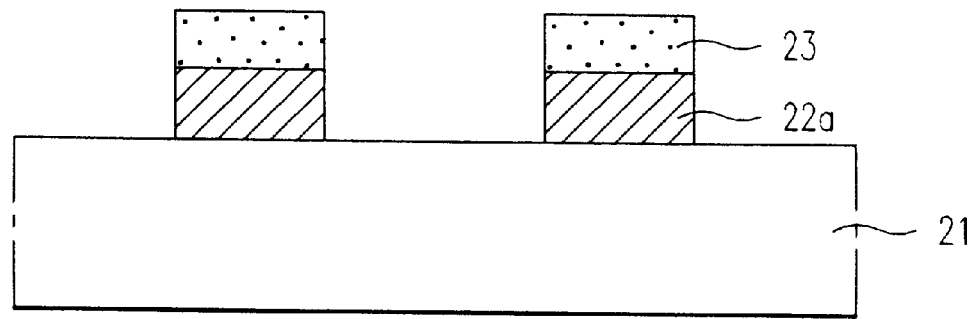

As shown in FIG. 3b, using the first mask pattern 23 as a mask, the conductive layer 22 is selectively etched to form a lower line 22a.

Figure 3C:
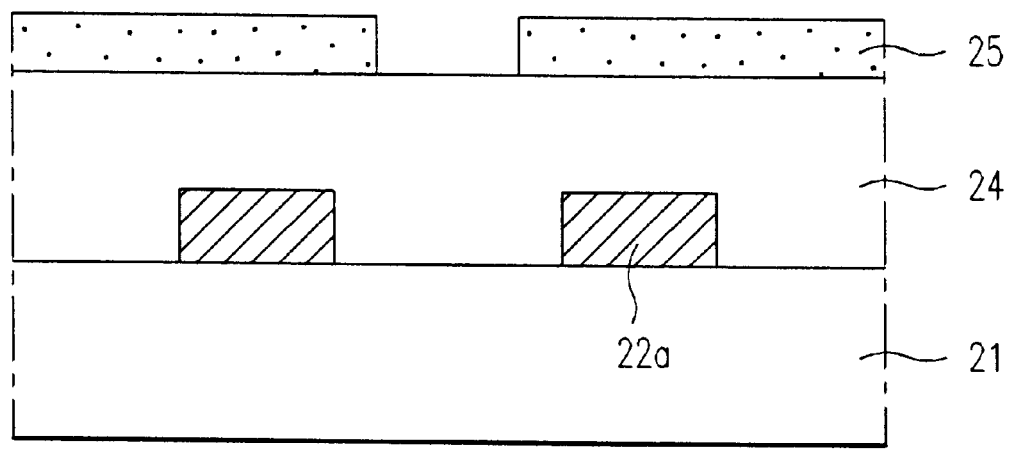

As shown in FIG. 3c, following removal of the first mask pattern 23, a planarizing insulating layer 24 is formed on the whole surface of the semiconductor substrate 21 including the lower line 22a by way of the ILD (Inter Layer Directric) technique.

There is then formed a photo resist on the planarizing insulating layer 24, with the photo resist being subject to exposure and development to be patterned into a second mask pattern.

Figure 3D:
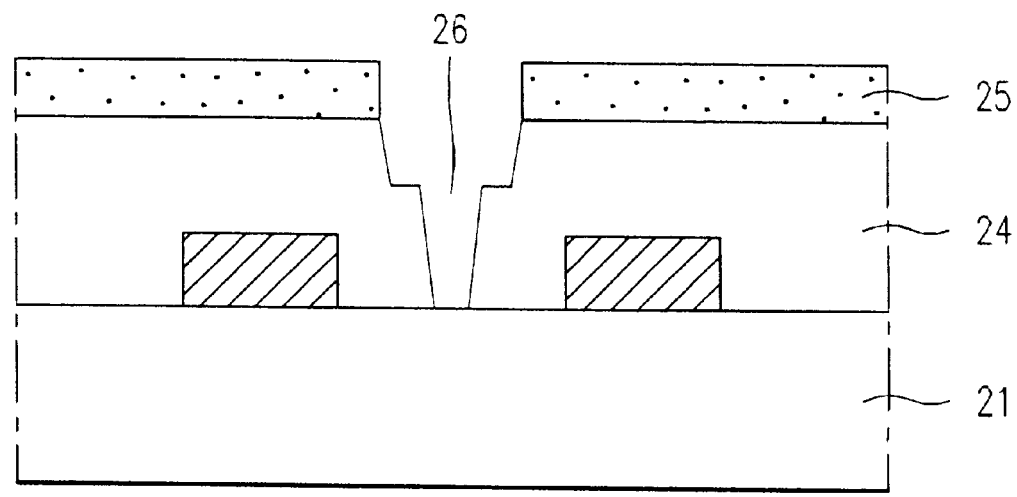

As shown in FIG. 3d, using the second mask pattern 25 as a mask, a plasma etching step is conducted to form a contact hole 26 which has a first slope of 83–88° and a second slope of 73–83°, exposing a defined portion of the surface on the semiconductor substrate 21.

At this stage, with the second mask pattern 25 used as a mask, the planarizing insulating layer 24 can be etched to a specified depth, forming a trench having a first slope, followed by forming contact hole 26 which has such a second slope more gentle than the first slope as to expose a defined portion of the surface on the semiconductor substrate 21.

Although not shown in the figures, after removal of the polymer layer, there are formed a plug consisting of a conductive material inside the contact hole having the first and second slopes, and the upper line electrically connected to the lower line through the plug.

As the plasma etching step goes on, a polymer layer 27 takes place on the lateral sides and bottom surface of the contact hole 26 having the first and second slopes due to the contact between the reaction gas and the etched surface of the contact hole 26.

Figure 4:
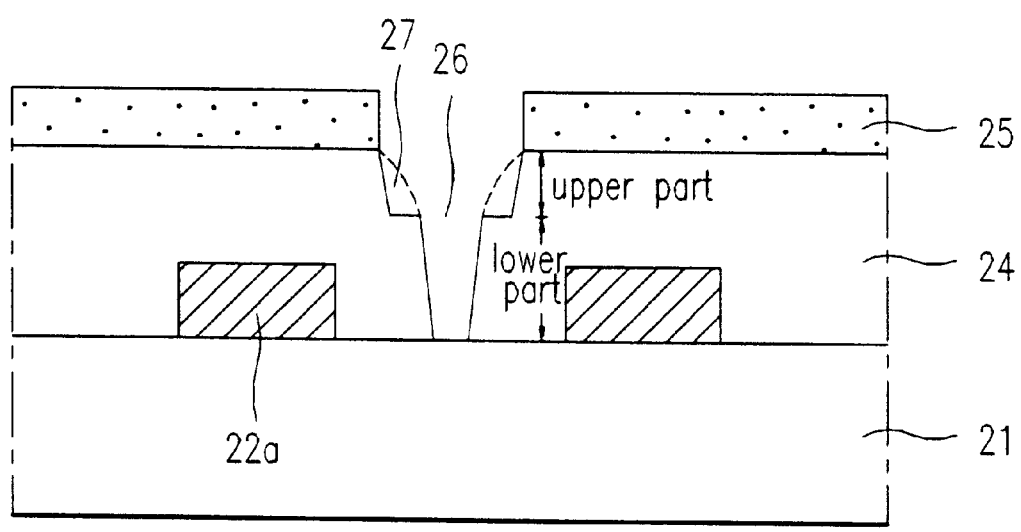
FIG. 4 is a detailed cross-sectional view illustrating the process for forming a contact hole having first and second slopes according to the present invention.

That is, as shown in FIG. 4, the upper part contact hole having the first slope is formed as deep as a specified depth with respect to the mask size of the second mask pattern 25 in the early time of the plasma etching using the second mask pattern 25 as a mask.

At a specified depth, the polymer layer 27 accumulated on the lateral sides and on the bottom surface of the upper part contact hole 26 acts as a sidewall such that plasma ions and radicals can hardly pass through the polymer 27, concentrating on the bottom surface of the upper part contact hole 26 having the first slope.

The second slope is forming with plasma ions and radicals concentrated on the bottom surface of the top end contact hole 26 having the first slope. On etching the center of the bottom of the contact hole forming the polymer layer 27, the lower part contact hole is formed to 60–70% of the upper part contact hole in width.

This makes all conditions of hardware or reaction gas better for easier formation of the polymer layer unlike the general contact process using a reaction gas that produces less polymer.

On the other hand, the plasma etching is carried out under the conditions of 1–10 mT pressure, RF power of 500–1500 W, and 1000–2000 W bias power, making use of a mixed reaction gas of $CHF_3$, $C_2HF_5$ and $C_4F_8$ at a specified ratio.

When the ratio of $CHF_3$:$C_2HF_5$:$C_4F_8$ is 2:2:0.8–1.2, the second slope is formed at the position as deep as one third of the entire depth of the contact hole from the top to the bottom, while the second slope occurs at the position half the depth with the ratio of mixed reaction gases being 2:2:0.5–0.7 and at the position as deep as two thirds of the depth with the ratio of 2:2:0–0.4.

FIG. 5 is a diagram illustrating the factors that determine the ratio of reaction gases in forming the contact hole having double slopes according to the present invention.

These factors are the width, depth and surface area (for a contact hole in the rectangular form) of the contact hole, and the material of the insulating layer.

That is, when the contact hole is large in width, the proportions of $CHF_3$ and $C_2HF_5$ are maintained, with that of $C_4F_8$ being increased. For the contact hole having a large depth, the proportions of $CHF_3$ and $C_2HF_5$ are maintained, with that of $C_4F_8$ being reduced.

Further, where the contact hole is large in surface area, the proportions of $CHF_3$ and $C_4F_8$ are reduced, with that of $C_2HF_5$ being maintained. If the insulating layer is large in hardness, the proportion of $CHF_3$ is maintained, with those of $C_4F_8$ and $C_2HF_5$ being decreased.

Such as in the present invention above described, it is provided with a contact hole of a semiconductor device has double slopes, which is formed by a single step of plasma etching, eliminating the processes relating to a cap layer for the prevention of short-circuits of the lower line, with consequence of simplified process and reduction in costs.

It will be apparent to those skilled in the art that various modifications and variations can be made in the contact hole of a semiconductor device and its forming method according to the present invention without departing from the spirit or scope of the invention. Thus, it is intended that the present invention cover the modifications and variations of this invention provided they come within the scope of the appended claims and their equivalents.

What is claimed is:

1. A method for forming a contact hole of a semiconductor device, comprising the steps of:

forming a conductive layer on a semiconductor substrate, and subsequently a first mask pattern directly on top of the conductive layer;

selectively eliminating the conductive layer making use of the first mask pattern as a mask, forming a lower line;

removing the first mask pattern, and forming an insulating layer on the whole surface of the semiconductor substrate including the lower line;

forming a second mask pattern on the insulating layer;

etching the insulating layer to a specified depth making use of the second mask pattern as a mask, accumulating a polymer layer on the lateral sides of and on the lower part of the etched insulating layer, thereby forming the upper part of the contact hole having a first slope; and forming a lower part of the contact hole having a second slope, making use of the polymer and the second mask pattern as a mask, thereby exposing a defined portion of the surface on the semiconductor substrate.

2. The method as defined in claim 1, wherein the insulating layer is subject to a plasma etching step under the conditions of 1–10 mT pressure, 500–1500 W RF power and 100–2000 W bias power.

3. The method as defined in claim 1, wherein a reaction gas used for plasma-etching the insulating layer is a mixture of $CHF_3$, $C_2HF_5$ and $C_4F_8$ at a specified ratio.

4. The method as defined in claim 3, wherein when the ratio of $CHF_3$, $C_2HF_5$ and $C_4F_8$ in the mixture is 2:2:0.8–1.2, the second slope appears at a position which is one third of the entire depth of the contact hole from the top to the bottom.

5. The method as defined in claim 3, wherein when the ratio of $CHF_3$, $C_2HF_5$ and $C_4F_8$ in the mixture is 2:2:0.5–0.7, the second slope appears at a position which is half the entire depth of the contact hole.

6. The method as defined in claim 3, wherein when the ratio of $CHF_3$, $C,HF_5$ and $C_4F_8$ in the mixture is 2:2:0–0.4, the second slope appears at a position which is two thirds of the entire depth of the contact hole from the top to the bottom.

7. The method as defined in claim 3, wherein when the ratio of $CHF_3$, $C_2HF_5$ and $C_4F_8$ in the mixture is dependent on the width, depth and surface area of the contact hole, as well as the material of the insulating layer.

8. The method as defined in claim 7, wherein when the contact hole is large in width, the proportions of $CHF_3$ and $C_2HF_5$ are maintained, with that of $C_4F_8$ being increased.

9. The method as defined in claim 7, wherein when the contact hole has a large depth, the proportions Of $CHF_3$ and $C_2HF_5$ are maintained, with that of $C_4F_8$ being reduced.

10. The method as defined in claim 7, wherein when the contact hole is large in surface area, the proportions of $CHF_3$ and $C_4F_8$ are reduced, with that of $C_2HF_5$ being maintained.

11. The method as defined in claim 7, wherein when the insulating layer is large in hardness, the proportion of $CHF_3$ is maintained, with those of $C_4F_8$ and $C_2HF_5$ being decreased.

* * * * *